Jan. 20, 1970 A. M. WALKOW 3,491,197

UNIVERSAL PRINTED CIRCUIT BOARD

Filed Dec. 30, 1966 4 Sheets-Sheet 1

INVENTOR
Arnold M. Walkow

BY René E. Grossman

ATTORNEY

Jan. 20, 1970 A. M. WALKOW 3,491,197

UNIVERSAL PRINTED CIRCUIT BOARD

Filed Dec. 30, 1966 4 Sheets-Sheet 2

Jan. 20, 1970 A. M. WALKOW 3,491,197

UNIVERSAL PRINTED CIRCUIT BOARD

Filed Dec. 30, 1966 4 Sheets-Sheet 3

United States Patent Office 3,491,197
Patented Jan. 20, 1970

3,491,197

UNIVERSAL PRINTED CIRCUIT BOARD

Arnold M. Walkow, Houston, Tex., assignor to Texas Instruments Incorporated, Dallas, Tex., a corporation of Delaware Filed Dec. 30, 1966, Ser. No. 606,197
Int. Cl. H05k *1/00*
U.S. Cl. 174—68.5 2 Claims

ABSTRACT OF THE DISCLOSURE

Disclosed in a universal printed circuit board having a plurality of apertures, selected ones of said apertures being slug type apertures having insulating filler material therein and other of said apertures being feedthrough interconnection type apertures having insulating filler material lining the surface of said aperture with metallization on the surface of said filler electrically connecting the top and bottom of said board. At least one conductive path secured to each side of said board overlay certain of said feedthrough type and slug type apertures for interconnecting said conductive paths and for forming isolated portions of said conductive path upon removal of said slugs, respectively.

This invention relates to a method of and apparatus for forming a universal printed circuit board and the interconnections therefor.

Normally, the manufacture of printed circuit boards is accomplished by a photoetching process which requires inventorying of masks for each printed circuit board configuration. This usually is an impractical solution when manufacturing a large variety of such boards.

It is therefore an object of this invention to provide a universal printed circuit board which eliminates the need for carrying more than one board pattern in inventory.

Another object of the invention is to provide a universal printed circuit board which lends itself to computer design and fabrication.

Another object of the invention is to privide a method for manufacturing the universal printed circuit board of this invention.

A still further objective of the invention is to provide a method of manufacture of an easily removable feedthrough connection for the universal printed circuit board.

Other objects and features of the invention will become more readily understood from the following detailed description and appended claims when read in conjunction with the accompanying drawings in which like reference numerals designate like parts throughout the figures thereof, and in which:

FIGURES 1–7 are sequential plan views of the universal printed circuit board constructed according to the claimed invention.

FIGURES 1A–7A are sequential cross-sections taken along the line A—A of FIGURES 1–7, respectively, showing the progressive steps in the construction of the various feedthroughs of the board.

FIGURES 8 and 8A are plan and cross-sectional views, respectively, of a portion of a board which has had selected interconnections removed.

Figure 1:
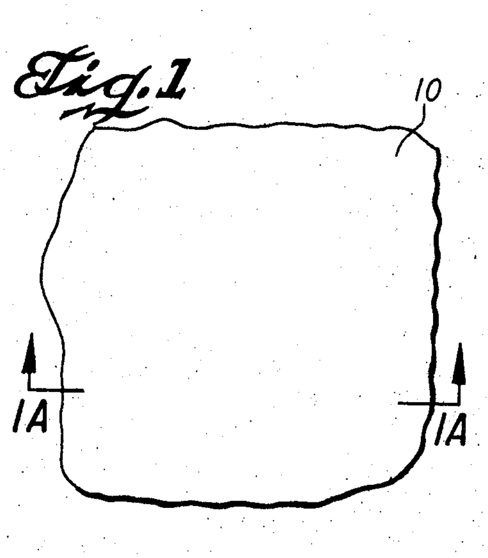

Referring now to FIGURE 1, there is illustrated the base material for the printed circuit board, that being an insulating material, such as glass fiber or other fiber-filled epoxy resin, Teflon or the like. This material provides an insulating structure for the conductive paths which will be placed on the board as described hereinafter.

Figure 1A:

FIGURE 1A illustrates the cross-section of the basic insulating board material.

Figure 2:
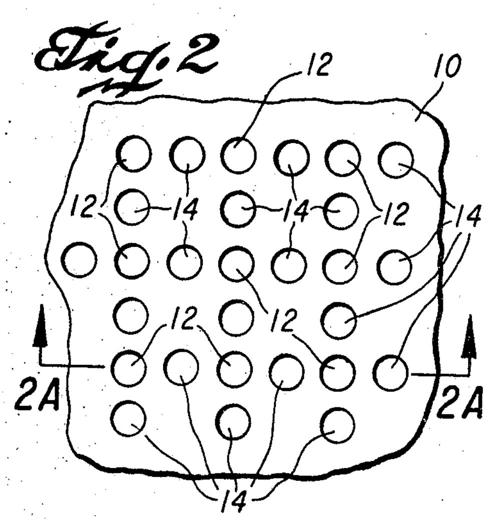
Figures 2A, 4:
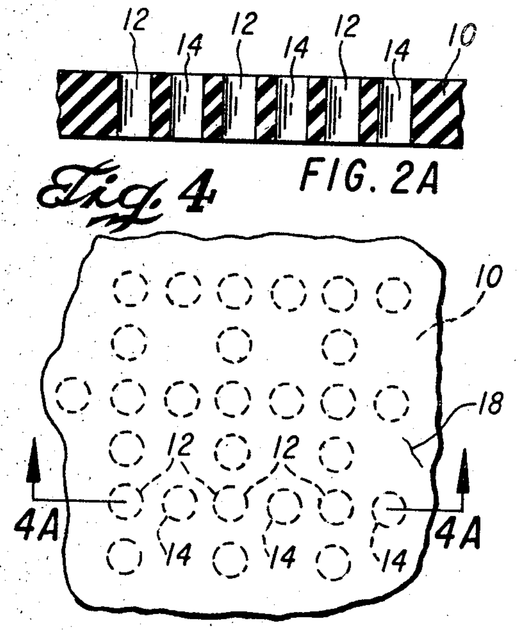

FIGURES 2 and 2A, respectively, show the plan and cross-section views of the second step in the method of fabricating the universal printed circuit board of this invention. This second step includes the perforation of the board with apertures 12 and 14 which extend through both sides of board 10 as shown in FIGURE 2A. These apertures form horizontal rows, with one row having alternate spacing of apertures 12 and 14 while the next horizontal row includes only aperture 14. This pattern continues throughout the board. This step may be combined in the initial fabrication of the board by pre-casting the apertures in the pattern before-mentioned. In the eventual fabrication of this universal printed circuit board, aperture 12 will contribute in forming a feedthrough connection; aperture 14 will contribute to the formation of a slug which will be under conductive paths formed on one side of circuit board 10 and which will isolate that path electrically into two portions upon removing the slug. If the insulating board 10 is thin enough, apertures 14 may not be necessary, as the conductive paths and the board may be perforated in one step.

Figure 3:
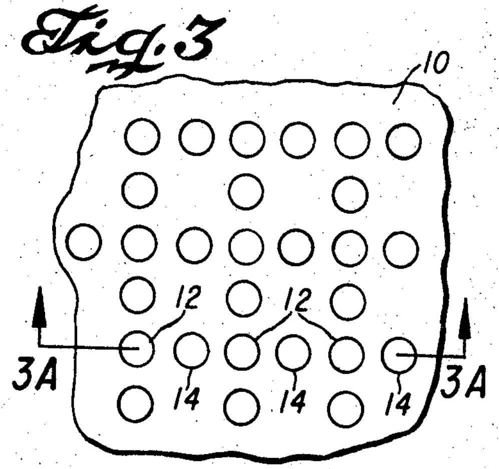
Figure 3A:
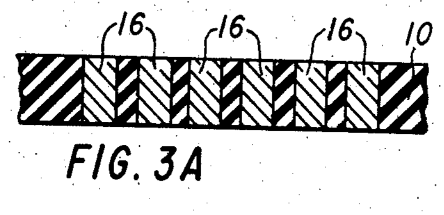
Figure 4A:
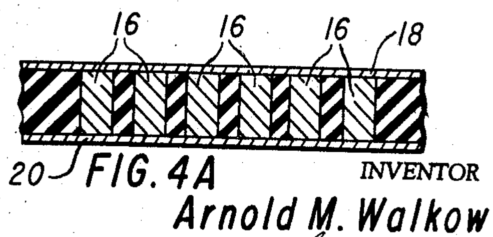

FIGURES 3 and 4 (and 3A and 4A) illustrate the steps of filling the apertures 12 and 14 with low shrinkage filler 16 and laminating metal layers 18 and 20 on the top and bottom, respectively, of insulating board 10. This low shrinkage filler may be an epoxy compound, while the metal layers 18 and 20 may be copper or the like.

Figures 5, 5A, 6, 6A, 7, 7A, 8, 8A:
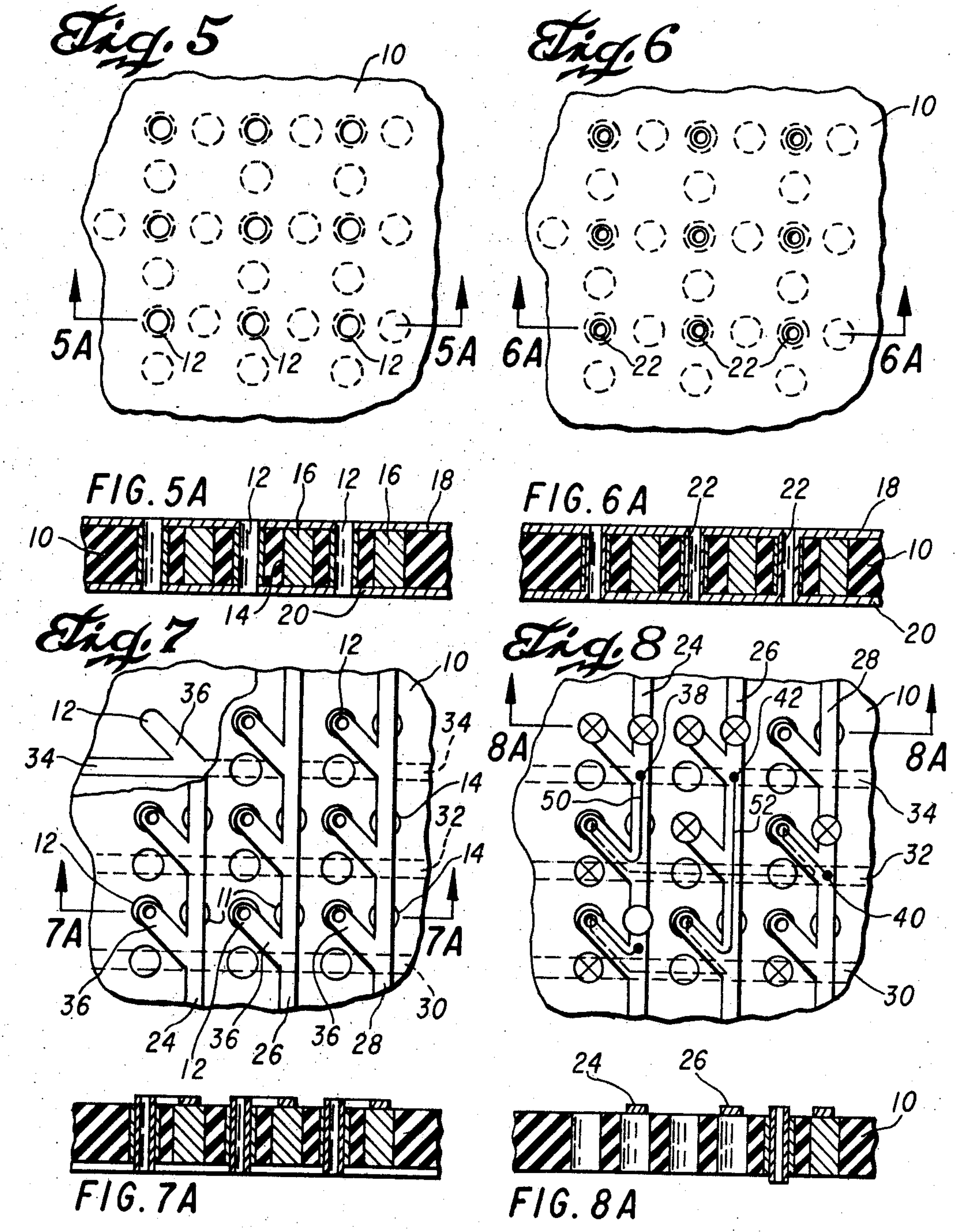

FIGURES 5 and 5A illustrate the step of drilling or otherwise obtaining transfer holes through the center of apertures 12. These transfer holes are of slightly less diameter than apertures 12 and therefore leave a lining of filler material around the apertures 12 (FIGURE 5A). This drilling of transfer holes also removes that portion of conductive metal material immediately above and below insulating board 10.

FIGURES 6 and 6A illustrate the step of metallizing or plating through the apertures 12 to thereby form a connection between metallic conductive layers 18 and 20. This metallizing of the surface of the filler will thereby interconnect every aperture 12 to conductive metal layers 18 and 20. The steps outlined in FIGURES 5 and 6 may be combined into one step by the insertion in apertures 12 of filler material with the conductive feedthroughs already included, that is, pre-metallized slugs. As an alternate to this, all-metallic slugs may be inserted in apertures 12 with the conductive path attached by welding or similar method to the metallic slug.

FIGURES 7 and 7A illustrate the final step in the fabrication of the universal printed circuit board (i.e., prior to selective removal of interconnections for a particular application of a printed circuit board), that step being photoetching away the undesired conductive metallic layer to thereby form vertical conductive paths 24, 26 and 28 and horizontal conductive paths 30, 32 and 34. These vertical and horizontal conductive pairs overlay apertures 14 which have filler material therein and which form an easily removable slug. By selectively removing slugs 14 from the conductive path side of board 10, isolation of various portions of the conductive paths is achieved. Each conductive path has a plurality of arms 36 which extend from the conductive paths on the top and bottom to and through plated-through apertures 12. Accordingly, before selectively removing certain of the plated-through interconnections formed in aperture 12, each vertical and horizontal conductive path is connected to one another.

FIGURES 8 and 8A illustrate the method of selectively removing certain of the interconnections formed on a portion of the universal printed circuit board 10 to interconnect certain discrete points of the board to other points of the board prior to mounting the components. The "X" indicates the slugs (interconnections) which have been selectively removed. In this particular example, point 38 is wired to point 40 while point 42 is wired to point 44; the two paths are completely isolated via the selected removal of the slugs. Referring to FIGURE 8, point 38 is connected to point 40 (via line 50) along conductive path 24 to arm 46, through the plated-through interconnection connected to arm 46 which also interconnects to conductive path 32, along the path 32 on the underside of board 10, up through the plated-through interconnection to arm 48 and then to point 40 located on conductive path 28. In like manner, line 52 indicates the path taken to interconnect points 42 and 44.

The selective removal of these slugs (interconnections) which were formed in apertures 12 and 14 can be performed by mechanical punching, air blasts, arc discharges or laser beams.

Figure 9:
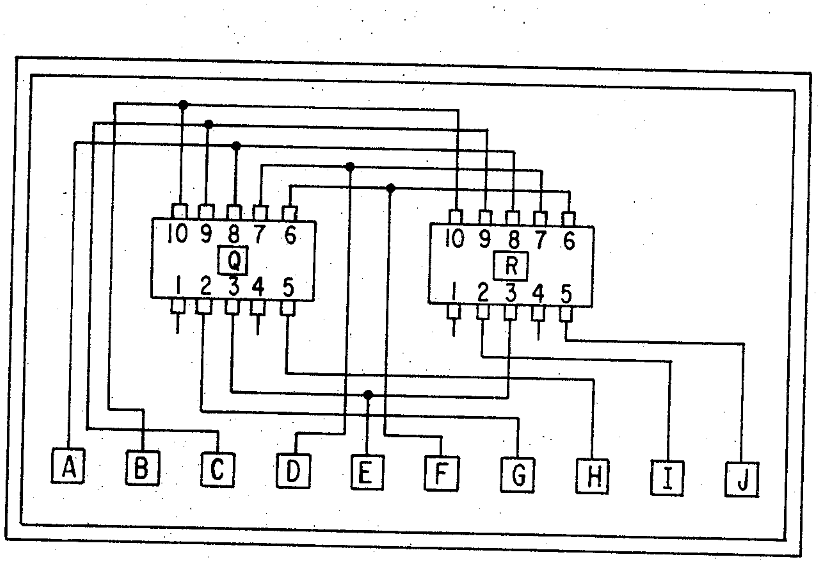
FIGURE 9 shows the wiring diagram of two semiconductor networks and their connections to terminals A–J.

FIGURE 9 shows an illustrative wiring diagram for two semiconductor networks (SCN Q and SCN R), each having ten leads extending therefrom which are selectively connected to terminals A–J. As an example, terminal A is connected to terminal 8 of SCN Q and terminal 8 of SCN R. Terminal B is connected to lead 9 of SCN Q and lead 9 of SCN R.

Figure 10:
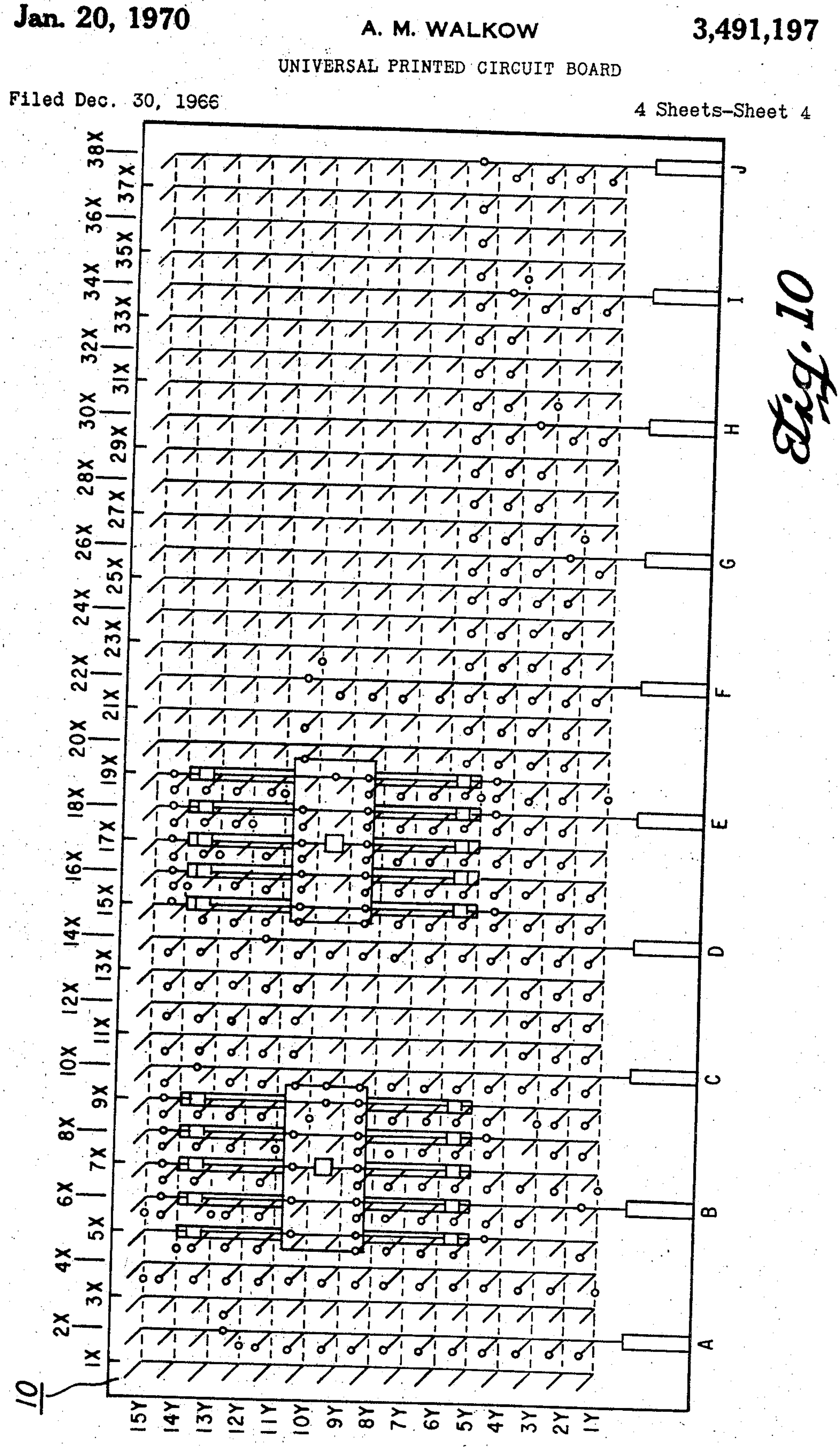
FIGURE 10 illustrates a printed circuit with the appropriate interconnections removed, thereby interconnecting the board in accordance with the wiring diagram of FIGURE 9.

FIGURE 10 illustrates a universal printed circuit board constructed according to the present invention which is configured according to the wiring diagram illustrated in FIGURE 9. Conductive paths 1X–38X represent those paths running vertically on the top of insulating board 10, while conductive paths 1Y–15Y represent those paths running horizontally on the bottom of printed circuit board 10. The angular arms extending from each of the vertical and horizontal paths form interconnections which electrically connect the top and bottom paths (as previously shown in the example of FIGURE 8). Also any path may be isolated into separate portions by the selected removal of slugs which underlie the conductive path.

To demonstrate how selective slugs have been removed to selectively wire the printed circuit board in the manner as shown in FIGURE 9, the wiring of terminals A and B will be used as illustrative. The circles at various points along the conductive paths and at selected points on the arms extending from those conducting paths, indicate that the slugs (interconnections) are removed at those points.

Terminal A is connected via conductive path 2X on the top of board 10, through the feedthrough connection at the intersection of path 2X and 12Y, along conductive path 12Y on the bottom side of board 10, up through the interconnection formed at the intersection of paths 12Y and 7X, which thereby connects to lead 8 which has been welded to conductive path 7X. As will be noted, conductive path 12Y is also connected to conductive path 17X through the interconnection at the intersection of 17X and 12Y which connects path 12Y (and terminal B and lead 8 of SCN Q) to lead 8 of SCN R.

Terminal B is connected to lead 10 of SCN Q and R via conductive path 6X, down through the feedthrough at the interconnection of 6X and 1Y, along conductive path 1Y, up through the interconnection at the intersection of 1Y and 4X, then along the conductive path 4X, down the interconnection at the intersection of 4X ad 15Y along conductive path 15Y until the intersection of conductive path 5X; at the intersection of 5X and 15Y the electrical connection is formed through the interconnection at that point to conductive path 5X which is welded to lead 10 of SCN Q. This lead (and terminal B) is also interconnected to lead 10 of SCN R by way of path 5X, down through the interconnection formed at the intersection of path 5X and 14Y, along the path 14Y to the path 15X, up the interconnection formed at the intersection of 15X and 14Y to conductive path 15X which is welded to lead 10 of SCN R.

This universal printed circuit board makes it possible for a computer to design and issue instructions for board fabrication. The selective removal of the undesired interconnections lends itself for including design information on magnetic programming tape or similar input media which is in turn fed into a computer.

While the present invention has been shown and illustrated in terms of a specific apparatus, it will be apparent that changes and modifications can be made without departing from the spirit and scope of the invention.

What is claimed is:

1. A universal circuit board comprising:

(a) an insulating board having at least first and second substantially parallel rows of apertures, said apertures in said first row comprised of alternate feedthrough connection type apertures and slug type apertures and said second row of apertures comprised of slug type apertures positioned adjacent said feedthrough connection type apertures in said first row, (b) each of said slug type apertures having insulating filler material therein, (c) each of said feedthrough connection type apertures having insulating filler material lining said aperture and metallization on the surface of said filler forming an easily removal electrical interconnection from one side of said board to the other, (d) at least one conductive path secured to said one side of said board which overlay a slug type aperture in said first row, said path having at least one conductive arm extending from said path to said feedthrough connection type aperture in said first row, and (e) at least one conductive path secured to said other side of said board which overlay a slug type aperture in said second row, said path having at least one conductive arm extending from said path connected to said feedthrough connection type aperture is said first row to form an interconnection between said conductive paths through said board.

2. A universal circuit board according to claim 1 in which said at least one conductive path on said one side of said board is substantially perpendicular to said at lease one conductive path on said other side of said board.

References Cited

UNITED STATES PATENTS

| | | | |
|---|---|---|---|
| 2,889,532 | 6/1959 | Slack. | |
| 3,098,951 | 7/1963 | Ayer et al. | 174—68.5 XR |
| 3,105,729 | 10/1963 | Rosenthal et al. | |
| 3,134,930 | 5/1964 | Wright. | |
| 3,226,802 | 1/1966 | Goodwin et al. | 174—68.5 XR |
| 3,334,395 | 8/1967 | Cook et al. | 174—68.5 XR |
| 3,356,786 | 12/1967 | Helms | 174—68.5 |
| 3,378,920 | 4/1968 | Cone | 174—68.5 XR |

DARRELL L, CLAY, Primary Examiner

U.S. Cl. X.R.

29—625; 317—101; 339—17